United States Patent
Cheng et al.

(10) Patent No.: US 10,985,193 B2
(45) Date of Patent: Apr. 20, 2021

(54) DISPLAY PANEL

(71) Applicant: Au Optronics Corporation, Hsinchu (TW)

(72) Inventors: Sheng-Yen Cheng, Hsinchu (TW); Min-Tse Lee, Hsinchu (TW); Yueh-Hung Chung, Taipei (TW); Ya-Ling Hsu, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 26 days.

(21) Appl. No.: 16/672,514

(22) Filed: Nov. 3, 2019

(65) Prior Publication Data

US 2020/0185417 A1    Jun. 11, 2020

Related U.S. Application Data

(60) Provisional application No. 62/775,469, filed on Dec. 5, 2018.

(30) Foreign Application Priority Data

Jun. 25, 2019 (TW) .................. 10812221.8

(51) Int. Cl.
  *H01L 29/786* (2006.01)
  *H01L 27/12* (2006.01)
  *G02F 1/1362* (2006.01)
  *G02F 1/1368* (2006.01)
  *H01L 49/02* (2006.01)

(52) U.S. Cl.
  CPC .......... *H01L 27/124* (2013.01); *G02F 1/1368* (2013.01); *G02F 1/136213* (2013.01); *G02F 1/136286* (2013.01); *H01L 27/1255* (2013.01); *H01L 28/60* (2013.01)

(58) Field of Classification Search
  CPC ... H01L 27/124; H01L 28/60; H01L 27/1255; G02F 1/136213; G02F 1/136286; G02F 1/1368
  See application file for complete search history.

(56) References Cited

U.S. PATENT DOCUMENTS

2018/0329241 A1    11/2018  Wang et al.
2018/0331123 A1*   11/2018  Wang ...................... H01L 27/32

FOREIGN PATENT DOCUMENTS

CN        102237355        11/2011
CN        107290910        10/2017

* cited by examiner

*Primary Examiner* — Victor A Mandala
*Assistant Examiner* — Colleen E Snow
(74) *Attorney, Agent, or Firm* — JCIPRNET

(57) ABSTRACT

A display panel includes pixels and a first conductive element. Each pixel includes a first signal line, a second signal line, a third signal line, a first switch, a second switch, a third switch, a first pixel electrode, a second pixel electrode, a first capacitor, a second capacitor, a third capacitor, and an insulating layer. The first signal lines are arranged in a first direction. Orthogonal projections of a first electrode of a second capacitor of a first pixel, a first electrode of a third capacitor of the first pixel, and a first contact window of an insulating layer of the first pixel on a first substrate are arranged in the first direction. The first conductive element is electrically connected to a second electrode of the third capacitor of the first pixel and a second electrode of the second capacitor of the first pixel through the first contact window.

17 Claims, 12 Drawing Sheets

DISPLAY PANEL

CROSS-REFERENCE TO RELATED APPLICATION

This application claims the priority benefits of U.S. provisional application Ser. No. 62/775,469, filed on Dec. 5, 2018, and Taiwan application serial no. 108122218, filed on Jun. 25, 2019. The entirety of each of the above-mentioned patent applications is hereby incorporated by reference herein and made a part of this specification.

BACKGROUND

Technical Field

The disclosure generally relates to a display panel.

Description of Related Art

With the development of display technologies, various display panels have been widely used in daily lives. For example, the display panels are applied to electronic devices, such as televisions, notebook computers, desktop computers, tablet computers, and mobile phones.

The display panel includes a plurality of pixels arranged in an array. In order to improve the performance of the display panel, for example, to improve the color wash-out, each pixel may include a primary sub-pixel and a secondary sub-pixel. Each sub-pixel includes a data line, a scanning line, a switch element, a pixel electrode, a common line, and the like. When the resolution of the display panel is increased, the proportion of the various components of each sub-pixel to the area of the sub-pixel is also increased, which affects the transmittance rate of the display panel. Therefore, how to set the components of the sub-pixels to improve the transmittance rate of the display panel is one of the problems faced by developers.

SUMMARY

The disclosure provides a display panel with high transmittance rate.

The display panel of the disclosure includes a first substrate, a plurality of pixels, and at least one first conductive element. Each of the pixels includes a first signal line, a second signal line, a third signal line, a first switch, a second switch, a third switch, a first pixel electrode, a second pixel electrode, a first capacitor, a second capacitor, a third capacitor and an insulating layer. Each of the first switch, the second switch and the third switch has a first end, a control end and a second end. Each of the first capacitor, the second capacitor and the third capacitor has a first electrode and a second electrode. The first end of the first switch is electrically connected to the first signal line. The control end of the first switch is electrically connected to the second signal line. The second end of the first switch is electrically connected to the first pixel electrode and the first electrode of the first capacitor. The first end of the second switch is electrically connected to the first signal line. The control end of the second switch is electrically connected to the second signal line. The second end of the second switch is electrically connected to the second pixel electrode and the first electrode of the second capacitor. The first end of the third switch is electrically connected to the first electrode of the second capacitor. The control end of the third switch is electrically connected to the third signal line, and the second end of the third switch is electrically connected to the first electrode of the third capacitor. The insulating layer is arranged on the second electrode of the second capacitor and the second electrode of the third capacitor. The first signal lines of the pixels are arranged in a first direction. The pixels include a first pixel. The insulating layer of the first pixel has a first contact window. A plurality of orthogonal projections of the first electrode of the second capacitor of the first pixel, the first electrode of the third capacitor of the first pixel, and the first contact window of the insulating layer of the first pixel on the first substrate are arranged in the first direction. The at least one first conductive element is disposed on the insulating layer and is electrically connected to the second electrode of the third capacitor of the first pixel and the second electrode of the second capacitor of the first pixel through the first contact window of the first pixel, and the second electrode of the first capacitor of the first pixel is electrically connected to the at least one first conductive element.

In order to make the aforementioned features and advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 4 corresponds to a split line A-A', a split line B-B' and a split line C-C' in FIG. 2.

DESCRIPTION OF THE EMBODIMENTS

Figure 1:
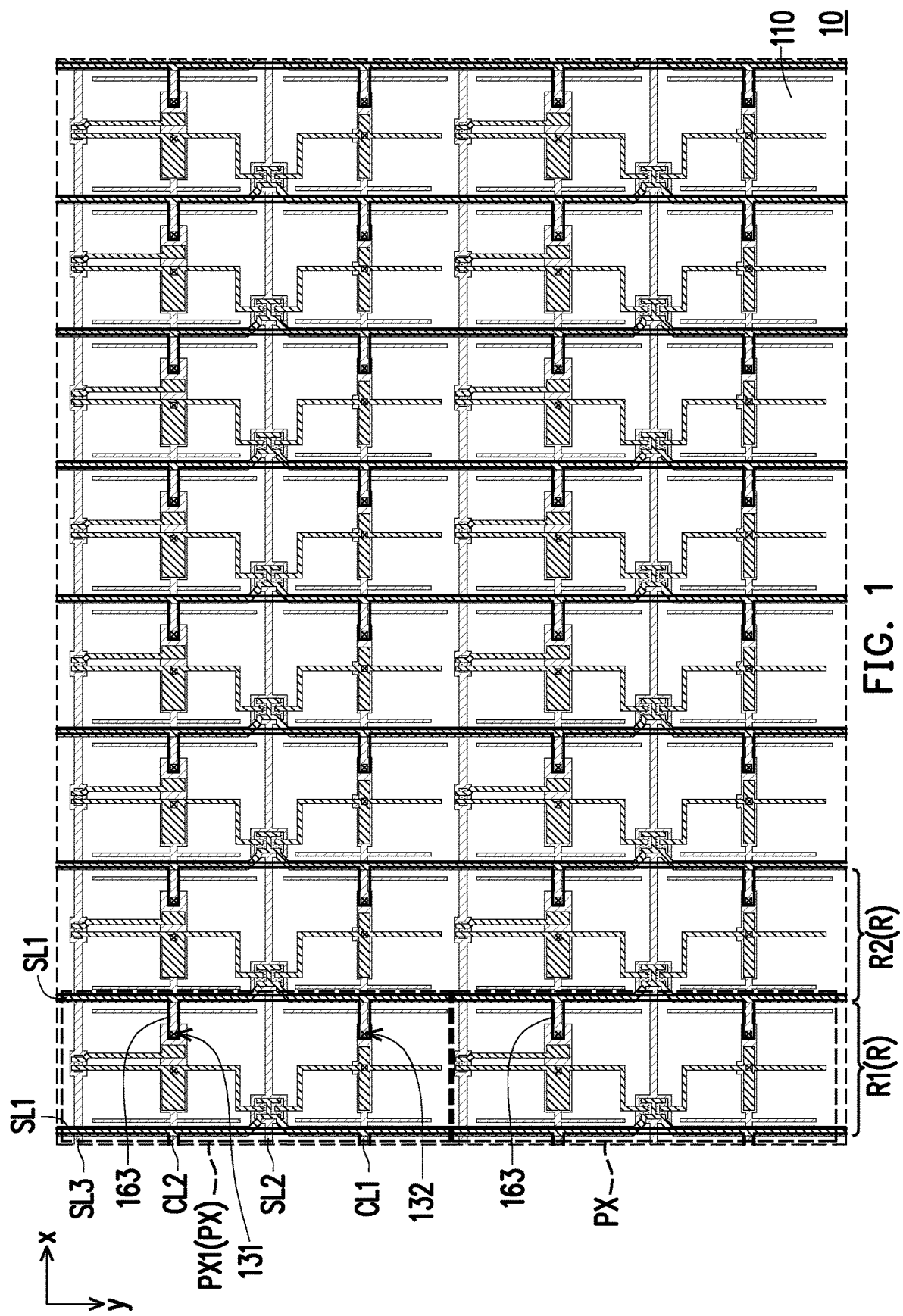
FIG. 1 is a top view of a display panel 10 of one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection. In addition, an "electrical connection" or "coupling" may be the another component between two components.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the disclosure belongs. It will be further understood that terms such as those defined in commonly used dictionaries should be interpreted as having a meaning that is consistent with their meaning in the context of the relevant art and the disclosure and will not be interpreted in an idealized or overly formal sense unless expressly so defined herein.

FIG. 1 is a top view of a display panel 10 of one embodiment of the disclosure.

Figure 2:
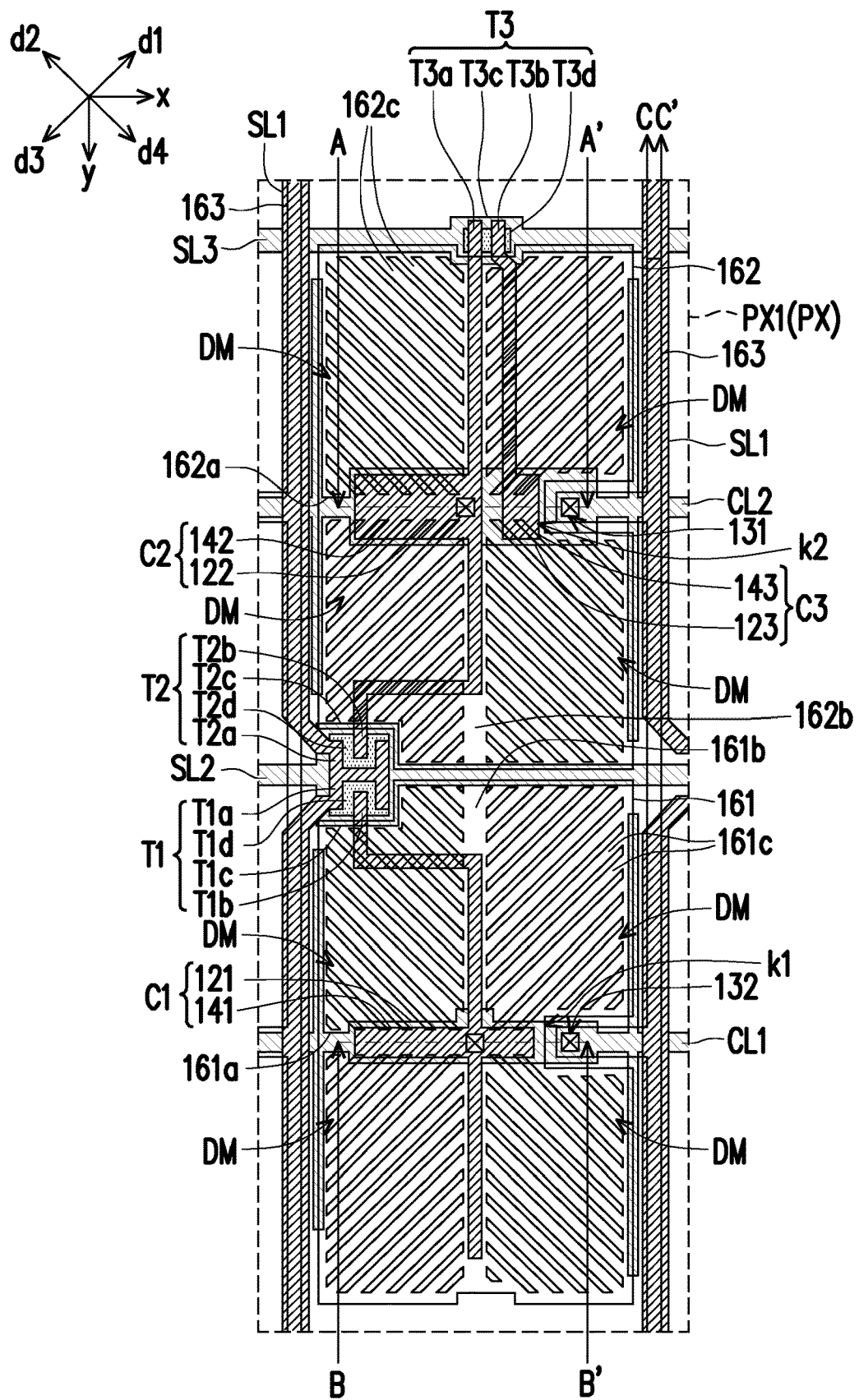
FIG. 2 is an enlarged schematic diagram of a pixel PX of one embodiment of the disclosure.

FIG. 2 is an enlarged schematic diagram of a pixel PX of one embodiment of the disclosure.

Figure 3:
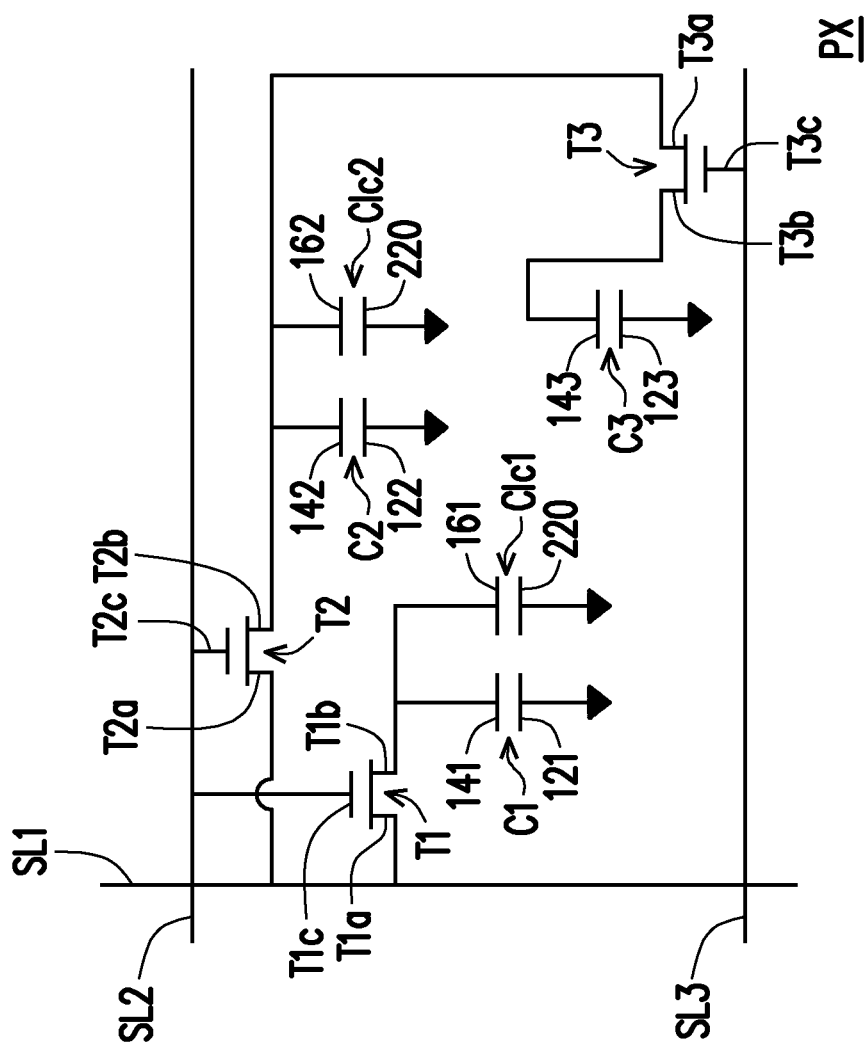
FIG. 3 is an equivalent circuit schematic diagram of a pixel PX of one embodiment of the disclosure.

FIG. 3 is an equivalent circuit schematic diagram of a pixel PX of one embodiment of the disclosure.

Figure 4:
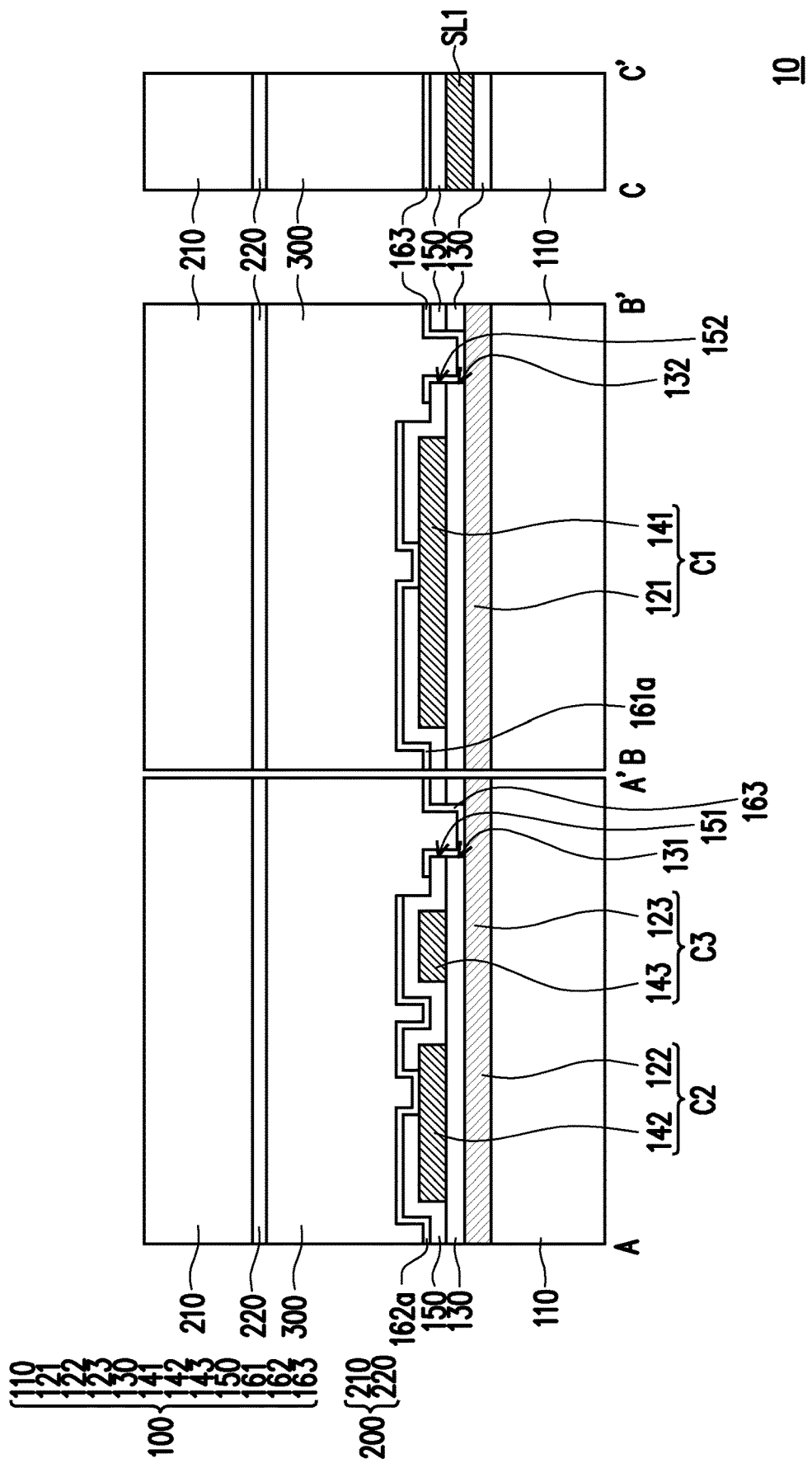
FIG. 4 is a cross-sectional schematic diagram of a display panel of one embodiment of the disclosure.

FIG. 4 is a cross-sectional schematic diagram of a display panel 10 of one embodiment of the disclosure. FIG. 4 corresponds to a split line A-A', a split line B-B' and a split line C-C' in FIG. 2.

For clear expression, an opposite substrate 200, first pixel electrodes 161 and second pixel electrodes 162 are omitted in FIG. 1.

With reference to FIG. 4, the display panel 10 includes a pixel array substrate 100, an opposite substrate 200 and display media 300. The pixel array substrate 100 includes a first substrate 110. The opposite substrate 200 includes a second substrate 210. The second substrate 210 is opposite to the first substrate 110. The display media 300 are disposed between the pixel array substrate 100 and the opposite substrate 200.

The first substrate 110 is mainly configured to support components of the pixel array substrate 100. For example, in the present embodiment, the material of the first substrate 110 may be glass, quartz, an organic polymer, or a light-proof/reflecting material (such as: a conductive material, a wafer, ceramic, or other suitable materials), or other suitable materials.

The second substrate 210 is mainly configured to encapsulate the display media 300. For example, in the present embodiment, the material of the second substrate 210 may be glass, quartz, an organic polymer, or other suitable materials.

In the present embodiment, the display media 300 are, for example, liquid crystals. However, the disclosure is not limited thereto. According to other embodiments, the display media 300 may also be organic electroluminescent materials or other suitable materials.

With reference to FIG. 1, FIG. 2, FIG. 3, and FIG. 4, the pixel array substrate 100 includes a first substrate 110 and a plurality of pixels PX disposed on the first substrate 110.

With reference to FIG. 2, FIG. 3, and FIG. 4, one pixel PX includes a first signal line SL1, a second signal line SL2, a third signal line SL3, a first switch T1, a second switch T2, a third switch T3, a first pixel electrode 161, a second pixel electrode 162, a first capacitor C1, a second capacitor C2, a third capacitor C3 and an insulating layer 130.

The first switch T1 includes a control end T1$c$, a semiconductor pattern T1$d$, a first end T1$a$ and a second end T1$b$. The insulating layer 130 may be disposed between the control end T1$c$ and the semiconductor pattern T1$d$. The first end T1$a$ and the second end T1$b$ are electrically connected to two different regions of the semiconductor pattern T1$d$, respectively.

The second switch T2 includes a control end T2$c$, a semiconductor pattern T2$d$, a first end T2$a$ and a second end T2$b$. The insulating layer 130 may be disposed between the control end T2$c$ and the semiconductor pattern T2$d$. The first end T2$a$ and the second end T2$b$ are electrically connected to two different regions of the semiconductor pattern T2$d$, respectively.

The third switch T3 includes a control end T3$c$, a semiconductor pattern T3$d$, a first end T3$a$ and a second end T3$b$. The insulating layer 130 may be disposed between the control end T3$c$ and the semiconductor pattern T3$d$. The first end T3$a$ and the second end T3$b$ are electrically connected to two different regions of the semiconductor pattern T3$d$, respectively.

The first capacitor C1 has a first electrode 141 and a second electrode 121. The second capacitor C2 has a first electrode 142 and a second electrode 122. The third capacitor C3 has a first electrode 143 and a second electrode 123. In the present embodiment, the insulating layer 130 may be disposed on the second electrodes 121, 122 and 123, and the first electrodes 141, 142 and 143 may be disposed on the insulating layer 130, but the disclosure is not limited thereto.

The first end T1$a$ of the first switch T1 is electrically connected to the first signal line SL1. The control end T1$c$ of the first switch T1 is electrically connected to the second signal line SL2. The second end T1$b$ of the first switch T1 is electrically connected to the first pixel electrode 161 and the first electrode 141 of the first capacitor C1. The first pixel electrode 161, the common electrode 220 and partial display media 300 that are located between the first pixel electrode 161 and the common electrode 220 form a first display medium capacitor C1$c$1. In the present embodiment, the pixel PX may further include a first common line CL1 electrically connected to the second electrode 121 of the first capacitor C1.

The first end T2$a$ of the second switch T2 is electrically connected to the first signal line SL1. The control end T2$c$ of the second switch T2 is electrically connected to the second signal line SL2. The second end T2$b$ of the second switch T2 is electrically connected to the second pixel electrode 162 and the first electrode 142 of the second capacitor C2. The second pixel electrode 162, the common electrode 220 and partial display media 300 that are located between the second pixel electrode 162 and the common electrode 220 form a second display medium capacitor C1$c$2.

The first end T3a of the third switch T3 is electrically connected to the first electrode 142 of the second capacitor C2. The control end T3c of the second switch T3 is electrically connected to the third signal line SL3. The second end T3b of the third switch T3 is electrically connected to the first electrode 143 of the third capacitor C3. In the present embodiment, the pixel PX may further include a second common line CL2 electrically connected to the second electrode 122 of the second capacitor C2 and the second electrode 123 of the third capacitor C3.

For example, in the present embodiment, the second signal line SL2, the third signal line SL3, the first common line CL1, the second common line CL2, the control end T1c of the first switch T1, the control end T2c of the second switch T2, the control end T3c of the third switch T3, the second electrode 121 of the first capacitor C1, the second electrode 122 of the second capacitor C2, and the second electrode 123 of the third capacitor C3 may be formed on a same first metal layer. The first signal line SL1, the first end T1a and the second end T1b of the first switch T1, the first end T2a and the second end T2b of the second switch T2, the first end T3a and the second end T3b of the third switch T3, the first electrode 141 of the first capacitor C1, the first electrode 142 of the second capacitor C2 and the first electrode 143 of the third capacitor C3 may be formed on a same second metal layer. The insulating layer 130 may be disposed between the first metal layer and the second metal layer, but the disclosure is not limited thereto.

With reference to FIG. 1, FIG. 2, and FIG. 4, the pixels PX include at least one first pixel PX1. The insulating layer 130 of each of the first pixels PX1 has a first contact window 131. The pixel array substrate 100 further includes at least one first conductive element 163 disposed on the insulating layer 130. Each of the first conductive elements 163 is electrically connected to the second electrode 123 of the third capacitor C3 of the first pixel PX1 and the second electrode 122 of the second capacitor C2 of the first pixel PX1 through the first contact window 131 of the first pixel PX1.

For example, in the present embodiment, the pixel array substrate 100 further includes an insulating layer 150 (as shown in FIG. 4), disposed on the second metal layer. In the present embodiment, the first conductive element 163 may be disposed on the insulating layer 150. The first conductive element 163 may be electrically connected to the second electrode 123 of the third capacitor C3 of the first pixel PX1 and the second electrode 122 of the second capacitor C2 of the first pixel PX1 through a first contact window 151 of the insulating layer 150 and the first contact window 131 of the insulating layer 130, but the disclosure is not limited thereto.

In the present embodiment, the first pixel electrode 161 and the second pixel electrode 162 of one pixel PX may be disposed on the insulating layer 150. That is, in the present embodiment, the first pixel electrode 161, the second pixel electrode 162 and the first conductive element 163 may be formed on a same film layer, but the disclosure is not limited thereto. For example, in the present embodiment, the first pixel electrode 161, the second pixel electrode 162 and the first conductive element 163 may be formed on a transparent conductive layer including a metal oxide, such as an indium tin oxide, an indium zinc oxide, an aluminum tin oxide, an aluminum zinc oxide, an indium germanium zinc oxide, other suitable oxides, or a stacking layer of at least two of the above, but the disclosure is not limited thereto.

The first conductive element 163 is electrically connected to the second electrodes 122, 123 of the second and third capacitors C2, C3 of the first pixel PX1, and is also electrically connected to the second electrode 121 of the first capacitor C1 of the first pixel PX1. That is, the first conductive element 163 is configured to electrically connect the first common line CL1 with the second common line CL2 of the same pixel PX.

For example, in the present embodiment, the insulating layer 130 further includes a second contact window 132. The first conductive element 163 may be electrically connected to the second electrode 121 of the first capacitor C1 of the first pixel PX1 through the second contact window 152 of the insulating layer 150 and the second contact window 132 of the insulating layer 130.

With reference to FIG. 1 and FIG. 2, the first signal lines SL1 of the pixels PX are arranged in a first direction x. The second signal lines SL2 of the pixels PX are arranged in a second direction y. The first direction x and the second direction y are interlaced. For example, in the present embodiment, the first direction x and the second direction y may be perpendicular, but the disclosure is not limited thereto. In addition, in the present embodiment, the third signal lines SL3, the first common lines CL1 and the second common lines CL2 of the pixels PX may be selectively arranged in the second direction y, but the disclosure is not limited thereto.

It is worth mentioning that a plurality of orthogonal projections of the first electrode 141 of the second capacitor C2 of the first pixel PX1, the first electrode 143 of the third capacitor C3 of the first pixel PX1, and the first contact window 131 of the insulating layer 130 of the first pixel PX1 on the first substrate 110 are arranged in the first direction x.

For example, in the present embodiment, the second pixel electrode 162 of the first pixel PX1 may include a plurality of main portions 162a, 162b and a plurality of branch portions 162c. The main portions 162a extend in the first direction x. The main portions 162b extend in the second direction y. The main portions 162a, 162b cross each other. The branch portions 162c is disposed on two opposite sides of the main portions 162a. The branch portions 162c is disposed on two opposite sides of the main portions 162b. The main portions 162a, 162b crosses each other to define a plurality of alignment regions DM. The branch portions 162c is respectively disposed in the alignment regions DM, and is electrically connected with the main portions 162a, 162b. Particularly, the main portions 162a extend in the first direction x, and the first electrode 142 of the second capacitor C2 of the first pixel PX1 and the first electrode 143 of the third capacitor C3 of the first pixel PX1 overlap the main portions 162a.

In the present embodiment, the display media (such as liquid crystals) 300 respectively disposed in the alignment regions DM of the second pixel electrode 162 are arranged along a plurality of different directions d1, d2, d3 and d4, respectively, and the display media 300 respectively disposed in the alignment regions DM form discontinuous regions at the positions of the main portions 162a, the positions of the main portions 162b and the positions beside the edges k2 of the main portions 162a. Therefore, the display panel 10 displays a plurality of interlaced disclination lines at the positions of the main portions 162a, the positions of the main portions 162b and the positions beside the edges k2 of the main portions 162a.

In the present embodiment, at least one of the first electrode 142 of the second capacitor C2 and the first electrode 143 of the third capacitor C3 overlaps the main portions 162a, and at least one of the first electrode 142 of the second capacitor C2 and the first electrode 143 of the third capacitor C3 and the first contact window 131 of the insulating layer 130 are arranged in an extending direction (namely the first direction x) of the main portions 162a. That is, at least one of the first electrode 142 of the second capacitor C2 and the first electrode 143 of the third capacitor C3 and the first contact window 131 of the insulating layer 130 are arranged at the position of one disclination line. Therefore, the influence of the setting of at least one of the first electrode 142 of the second capacitor C2 and the first electrode 143 of the third capacitor C3 and the first contact window 131 on the transmittance rate of the display panel 10 may be reduced.

In addition, in the present embodiment, a plurality of orthogonal projections of the first electrode 141 of the first capacitor C1 of the first pixel PX1 and the second contact window 132 of the insulating layer 130 of the first pixel PX1 on the first substrate 110 may be selectively arranged in the first direction x.

For example, in the present embodiment, the first pixel electrode 161 of the first pixel PX1 includes a plurality of main portions 161a, 161b and a plurality of branch portions 161c. The main portions 161a extend in the first direction x. The main portions 161b extend in the second direction y. The branch portions 161c is disposed on two opposite sides of the main portions 161a. The branch portions 161c is disposed on two opposite sides of the main portions 161b. The main portions 161a, 161b crosses each other to define a plurality of alignment regions DM. The branch portions 161c is respectively disposed in the alignment regions DM, and is electrically connected with the main portions 161a, 161b. Particularly, the first electrode 141 of the first capacitor C1 of the first pixel PX1 selectively overlaps one main portion 161a.

In the present embodiment, the display media (such as liquid crystals) 300 respectively disposed in the alignment regions DM of the first pixel electrode 161 are arranged along a plurality of different directions d1, d2, d3 and d4, respectively, and the display media 300 respectively disposed in the alignment regions DM form discontinuous regions at the positions of the main portions 161a, the positions of the main portions 161b and the positions beside the edges kl of the main portions 161a. Therefore, the display panel 10 may display a plurality of interlaced disclination lines at the positions of the main portions 161a, the positions of the main portions 161b and the positions beside the edges kl of the main portions 161a.

In the present embodiment, the first electrode 141 of the first capacitor C1 may overlap one main portion 162a, and the first electrode 141 of the first capacitor C1 and the second contact window 132 of the insulating layer 130 are arranged in the extending direction (namely the first direction x) of the main portion 162a. That is, in the present embodiment, the first electrode 141 of the first capacitor C1 and the second contact window 132 of the insulating layer 130 may be disposed at the position of the disclination line. Therefore, the influence of the first electrode 141 of the first capacitor C1 and the second contact window 132 of the insulating layer 130 on the transmittance rate of the display panel 10 may be reduced.

With reference to FIG. 1 and FIG. 2, the first signal lines SL1 of the pixels PX are arranged in the first direction x. The first pixel electrodes 161 and the second pixel electrodes 162 are arranged in the second direction y. The first direction x and the second direction y are interlaced. The pixels PX may include a plurality of pixel rows R. The pixels PX of each pixel row R are arranged in the second direction y.

In the present embodiment, the display panel 10 may include a plurality of first conductive elements 163. The second electrode 123 of the third capacitor C3, the second electrode 122 of the second capacitor C2 and the second electrode 121 of the first capacitor C1 of each pixel PX of each pixel row R may be electrically connected to the corresponding first conductive element 163, and the first conductive elements 163 electrically connected to the pixels PX of the same pixel row R may be directly connected, but the disclosure is not limited thereto.

In the present embodiment, the pixel rows R include a first pixel row R1 and a second pixel row R2 which are adjacent to each other. The first conductive elements 163 electrically connected to the pixels PX of the first pixel row R1 may be substantially disposed above the first signal lines SL1 of the pixels PX of the second pixel row R2. That is, in the present embodiment, the first conductive elements 163 electrically connected to the pixels PX of one pixel row R may overlap the first signal lines SL1 of the pixels PX of the next pixel row R, but the disclosure is not limited thereto.

It must be noted that the following embodiment uses the element reference numerals and partial contents of the aforementioned embodiments. The same reference numerals refer to the same or similar elements, and the description of the same technical content is omitted. The description of the omitted part may refer to the aforementioned embodiment, and thus is no longer repeated in the following embodiment.

Figure 5:
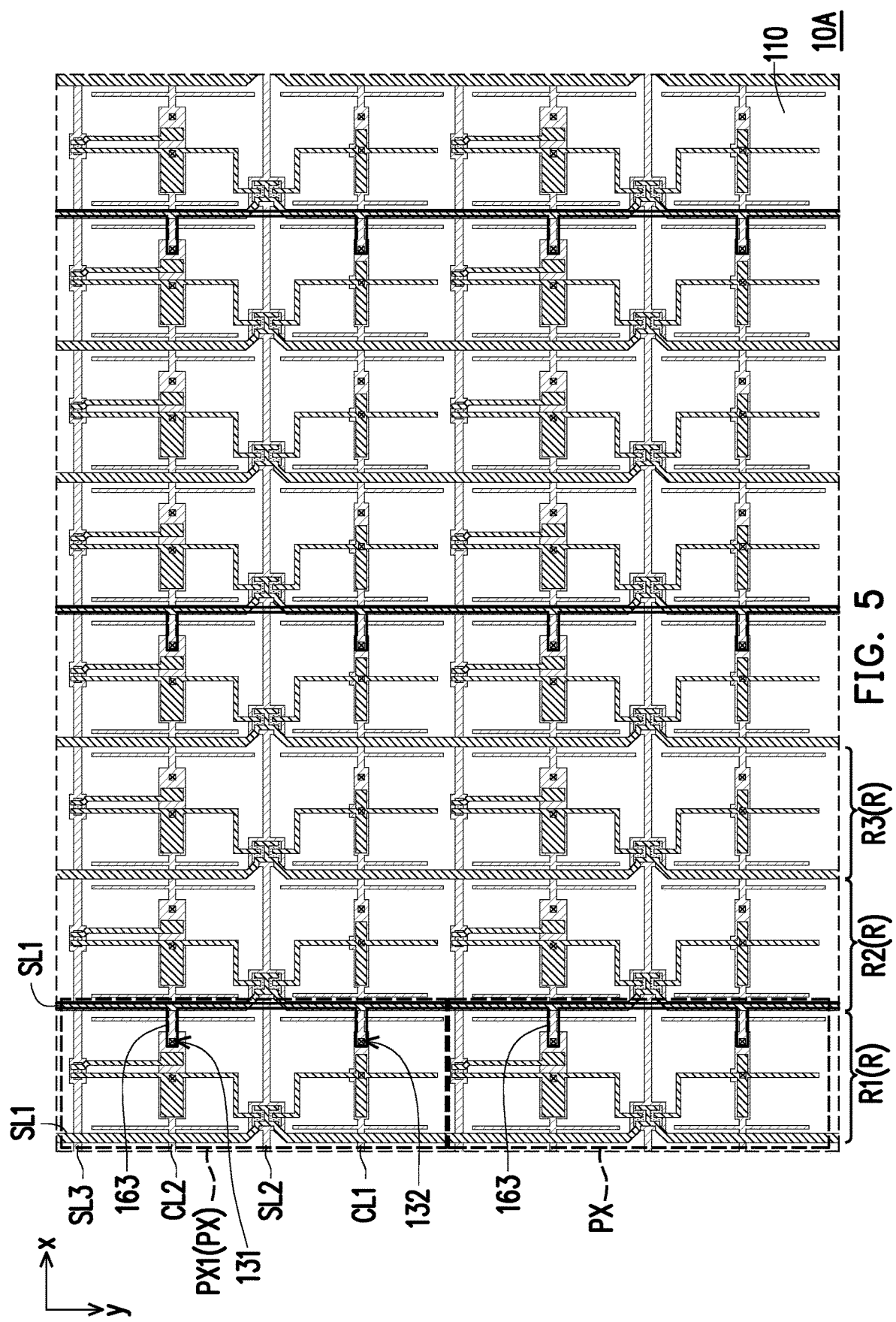
FIG. 5 is a top view of a display panel 10A of another embodiment of the disclosure.

FIG. 5 is a top view of a display panel 10A of another embodiment of the disclosure. The opposite substrate 200, the first pixel electrodes 161 and the second pixel electrodes 162 are omitted in FIG. 5.

The display panel 10A in FIG. 5 is similar to the display panel 10 in FIG. 1. A main difference therebetween is that: according to the embodiment illustrated in FIG. 5, not every pixel row R is provided with a plurality of first conductive elements 163.

With reference to FIG. 5, specifically, in the present embodiment, the pixels PX include a first pixel row R1, a second pixel row R2, and a third pixel row R3 which are sequentially arranged in the first direction x. The pixels PX of the first pixel row R1, the pixels PX of the second pixel row R2 and the pixels PX of the third pixel row R3 are respectively configured to display a first color, a second color and a third color. For example, in the present embodiment, the first color, the second color and the third color may be green, blue and red, respectively, but the disclosure is not limited thereto.

A difference from the aforementioned display panel 10 is that in the present embodiment, the first conductive elements 163 are electrically connected to the pixels PX of the first pixel row R1 and overlap the first signal lines SL1 of the pixels PX of the second pixel row R2. The first conductive elements 163 is not disposed on the first signal lines SL1 of the pixels PX of the first pixel row R1 and the first signal lines SL1 of the pixels PX of the third pixel row R3. Therefore, an overall load on the first signal lines SL1 of the display panel 10A may be reduced, which contributes to improving the performance of the display panel 10A.

In addition, it is worth mentioning that in the present embodiment, the pixels PX of the second pixel row R2 are configured to display the blue color, and the first conductive elements 163 overlap the first signal lines SL1 of the pixels PX of the second pixel row R2. That is, the first conductive elements 163 mainly cause a load on the first signal lines SL1 of the pixels PX that displays the blue color. Since the pixels PX that display the blue color have little impact on the overall brightness of the display panel 10A, the setting of the first conductive elements 163 are not liable to excessively affect the overall brightness of display panel 10A.

Figure 6:
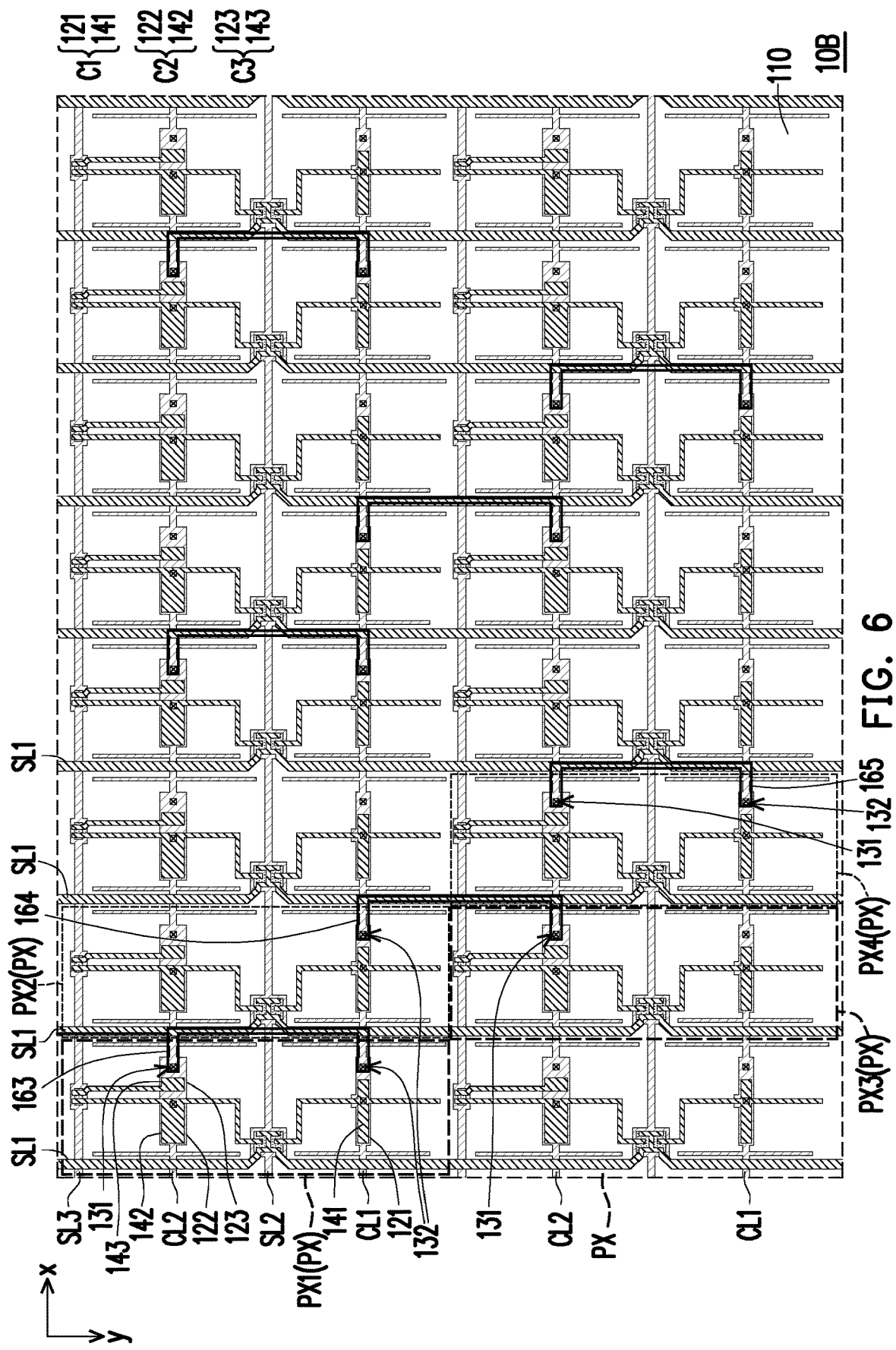
FIG. 6 is a top view of a display panel 10B of a further one embodiment of the disclosure.

FIG. 6 is a top view of a display panel 10B of a further one embodiment of the disclosure. The opposite substrate 200, the first pixel electrodes 161, and the second pixel electrodes 162 are omitted in FIG. 6.

The display panel 10B in FIG. 6 is similar to the display panel 10 in FIG. 1. A main difference therebetween is that: according to the embodiment illustrated in FIG. 1, each pixel PX is provided with a first conductive element 163 electrically connected to the first common line CL1 of the pixel PX and the second common line CL2 of the pixel PX, and the first conductive elements 163 on the same pixel row R are directly connected. According to the embodiment illustrated in FIG. 6, not every pixel PX is provided with the first conductive element 163 electrically connected to the first common line CL1 of the pixel PX and the second common line CL2 of the pixel PX, but partial pixels PX of all the pixels PX are provided with the first conductive elements 163. In addition, according to the embodiment illustrated in FIG. 6, the display panel 10B further includes a second conductive element 164 and a third conductive element 165 in addition to the first conductive elements 163.

With reference to FIG. 6, in the present embodiment, the pixels PX include a first pixel PX1, a second pixel PX2, a third pixel PX3, and a fourth pixel PX4. The first pixel PX1 and the second pixel PX2 are arranged in the first direction x. The second pixel PX2 and the third pixel PX3 are arranged in the second direction y. The third pixel PX3 and the fourth pixel PX4 are arranged in the first direction x, and the first pixel PX1 and the fourth pixel PX4 are respectively located on two opposite sides of the second pixel PX2 and the third pixel PX3.

In the present embodiment, the first pixel PX1 is configured to display a first color, the second pixel PX2 and the third pixel PX3 are configured to display a second color, and the fourth pixel PX4 is configured to display a third color. For example, in the present embodiment, the first color, the second color and the third color may be red, green and blue, but the disclosure is not limited thereto.

The third pixel PX3 has a first contact window 131. A plurality of orthogonal projections of the first electrode 142 of the second capacitor C2 of the third pixel PX3, the first electrode 143 of the third capacitor C3 of the third pixel PX3, and the first contact window 131 of the third pixel PX3 on the first substrate 110 are arranged in the first direction x.

The display panel 10B further includes the second conductive element 164. The second conductive element 164 is electrically connected to the second electrode 123 of the third capacitor C3 of the third pixel PX3 and the second electrode 122 of the second capacitor C2 of the third pixel PX3 through the first contact window 131 of the third pixel PX3. In the present embodiment, the second conductive element 164 may also be electrically connected to the second electrode 121 of the first capacitor C1 of the second pixel PX2 through a second contact window 132 of the second pixel PX2. In a word, the second conductive element 164 is electrically connected to the first common line CL1 of the second pixel PX2 and the second common line CL2 of the third pixel PX3.

The fourth pixel PX4 has a first contact window 131. A plurality of orthogonal projections of the first electrode 142 of the second capacitor C2 of the fourth pixel PX4, the first electrode 143 of the third capacitor C3 of the fourth pixel PX4 and the first contact window 131 of the fourth pixel PX4 on the first substrate 110 are arranged in the first direction x.

The display panel 10B further includes the third conductive element 165. The third conductive element 165 is electrically connected to the second electrode 123 of the third capacitor C3 of the fourth pixel PX4 and the second electrode 122 of the second capacitor C2 of the fourth pixel PX4 through the first contact window 131 of the fourth pixel PX4. In the present embodiment, the third conductive element 165 may also be electrically connected to the second electrode 121 of the first capacitor C1 of the fourth pixel PX4 through a second contact window 132 of the fourth pixel PX4. In a word, the third conductive element 165 is electrically connected to the second common line CL2 of the fourth pixel PX4 and the first common line CL1 of the fourth pixel PX4.

In the present embodiment, the first common lines CL1 and the second common lines CL2 which are adjacent to each other and alternately arranged are electrically connected with each other by the first conductive elements 163, the second conductive element 164 and the third conductive element 165.

In the present embodiment, all of the first conductive elements 163, the second conductive elements 164 and the third conductive elements 165 are not aligned in the first direction x and the second direction y.

The first conductive elements 163, the second conductive element 164 and the third conductive element 165 which are configured to connect the adjacent plurality of first common lines CL1 with second common lines CL2 are dispersedly disposed on the pixels PX configured to display different colors. Therefore, the load on the first signal lines SL1 of the pixels PX configured to display different colors may be averaged, which contributes to improving the performance of the display panel 10B.

Figure 7:
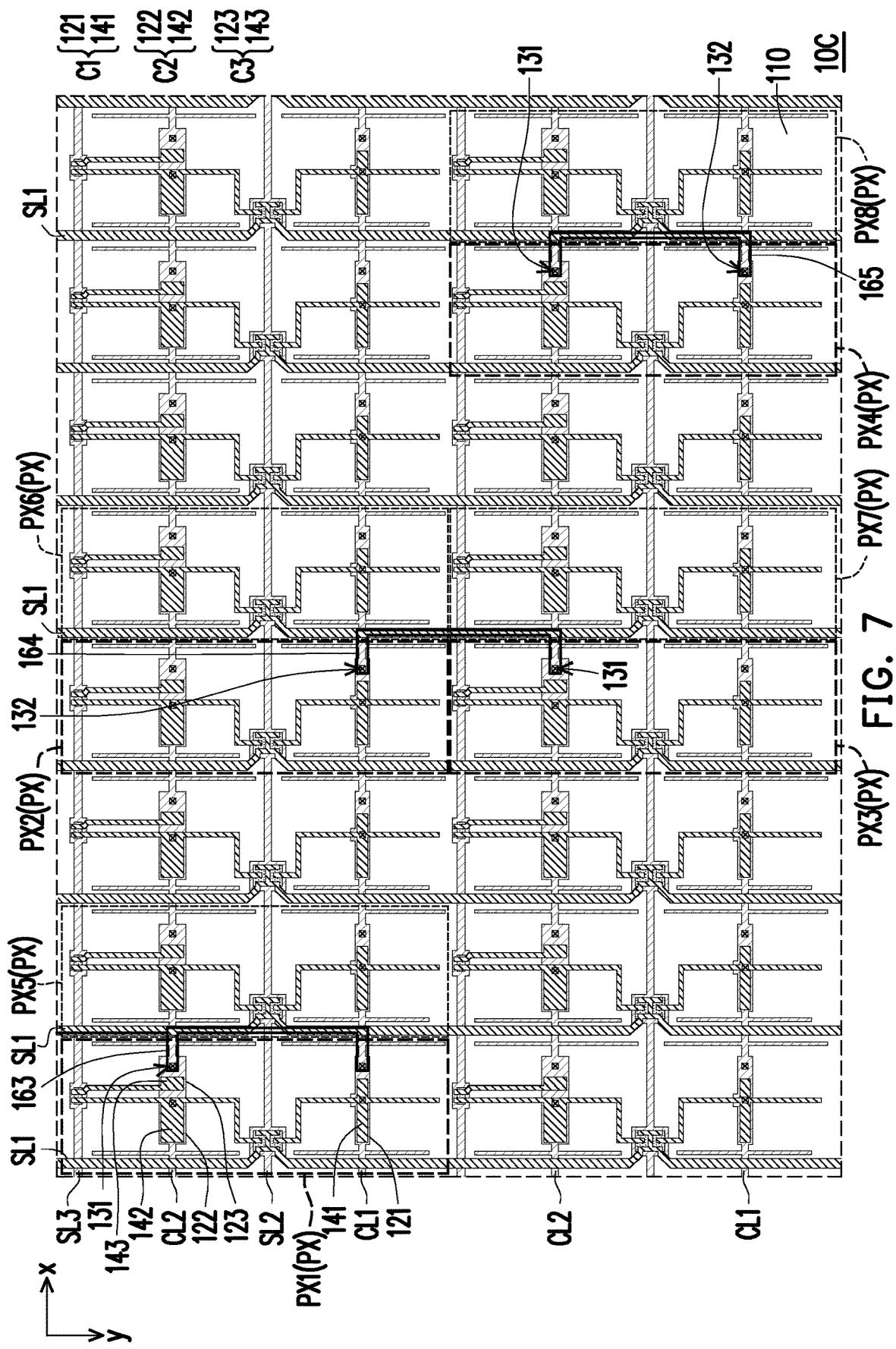
FIG. 7 is a top view of a display panel 10C of a still further embodiment of the disclosure.

FIG. 7 is a top view of a display panel 10C of a still further embodiment of the disclosure. The opposite substrate 200, the first pixel electrodes 161 and the second pixel electrodes 162 are omitted in FIG. 7.

The display panel 10C in FIG. 7 is similar to the display panel 10B in FIG. 6. A main difference therebetween is as follows.

With reference to FIG. 7, in the present embodiment, each pixel PX has a first side (for example: the right side) and an opposite second side (for example: the left side). The pixels PX further include a fifth pixel PX5, a sixth pixel PX6, a seventh pixel PX7 and an eighth pixel PX8 in addition to the first pixel PX1, the second pixel PX2, the third pixel PX3 and the fourth pixel PX4. The fifth pixel PX5, the sixth pixel PX6, the seventh pixel PX7 and the eighth pixel PX8 are respectively located on the first side of the first pixel PX1, the first side of the second pixel PX2, the first side of the third pixel PX3 and the first side of the fourth pixel PX4, and the fifth pixel PX5, the sixth pixel PX6, the seventh pixel PX7 and the eighth pixel PX8 are respectively aligned with the first pixel PX1, the second pixel PX2, the third pixel PX3 and the fourth pixel PX4 in the first direction x.

The first conductive element 163 overlaps the first signal line SL1 of the fifth pixel PX5. The second conductive element 164 overlaps the first signal line SL1 of the sixth pixel PX6 and the first signal line SL1 of the seventh pixel PX7. The third conductive element 165 overlaps the first signal line SL1 of the eighth pixel PX8.

Particularly, in the present embodiment, the fifth pixel PX5, the sixth pixel PX6, the seventh pixel PX7 and the eighth pixel PX8 are configured to display the blue color. That is, the first conductive elements 163, the second conductive elements 164 and the third conductive elements 165 which are configured to connect the adjacent plurality of first and second common lines CL1, CL2 are disposed on the first signal lines SL1 of the pixels PX configured to display the blue color.

In the present embodiment, the overall load on the first signal lines SL1 of the display panel 10C is low, and the first conductive element 163, the second conductive element 164 and the third conductive element 165 may further be dispersed in a dotted manner from the macroscopic angle, which contributes to improving the visual effect of the display panel 10C.

Figure 8:
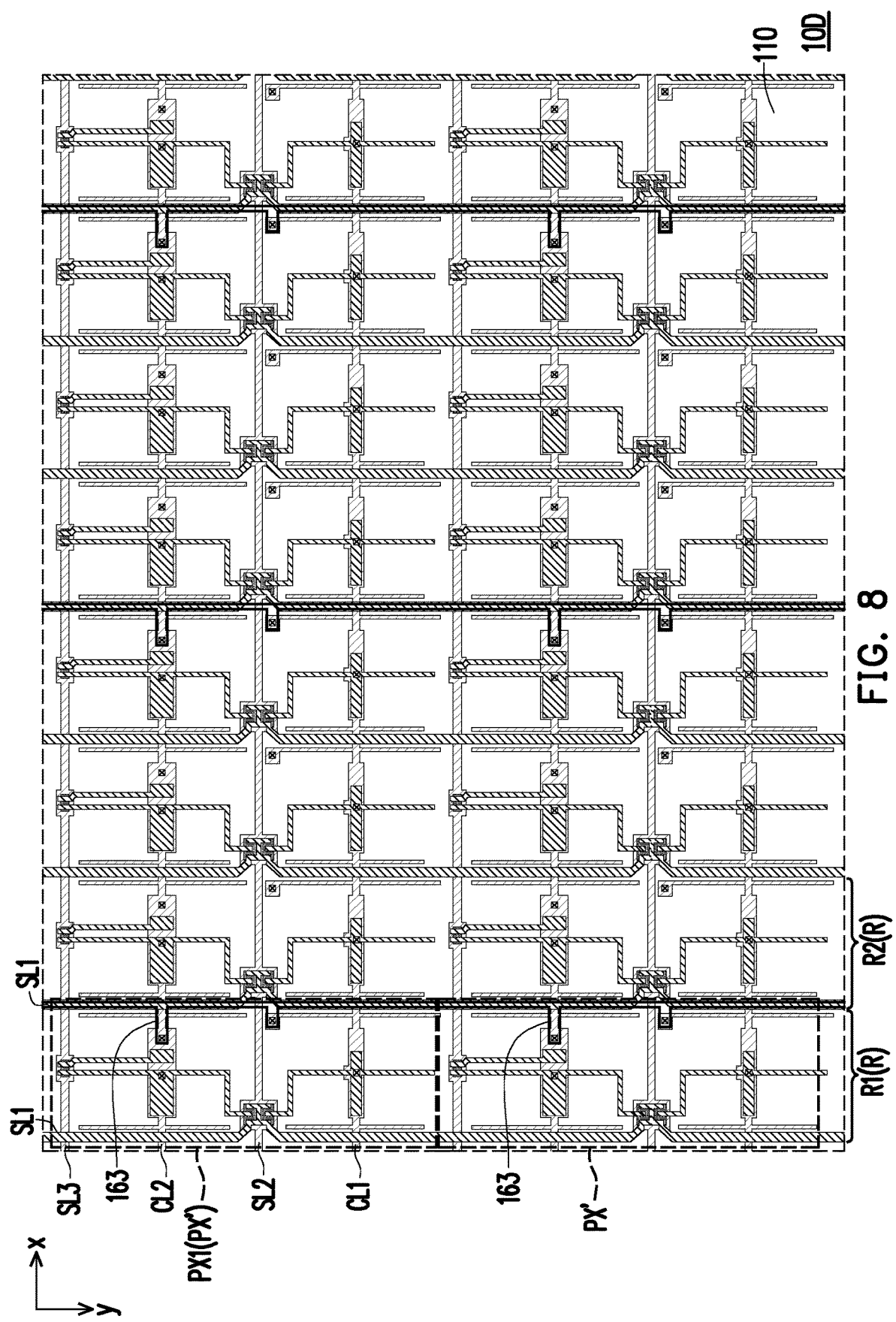
FIG. 8 is a top view of a display panel 10D of one embodiment of the disclosure.

FIG. 8 is a top view of a display panel 10D of one embodiment of the disclosure. For clear expression, the opposite substrate 200, the first pixel electrodes 161 and the second pixel electrodes 162 are omitted in FIG. 8.

Figure 9:
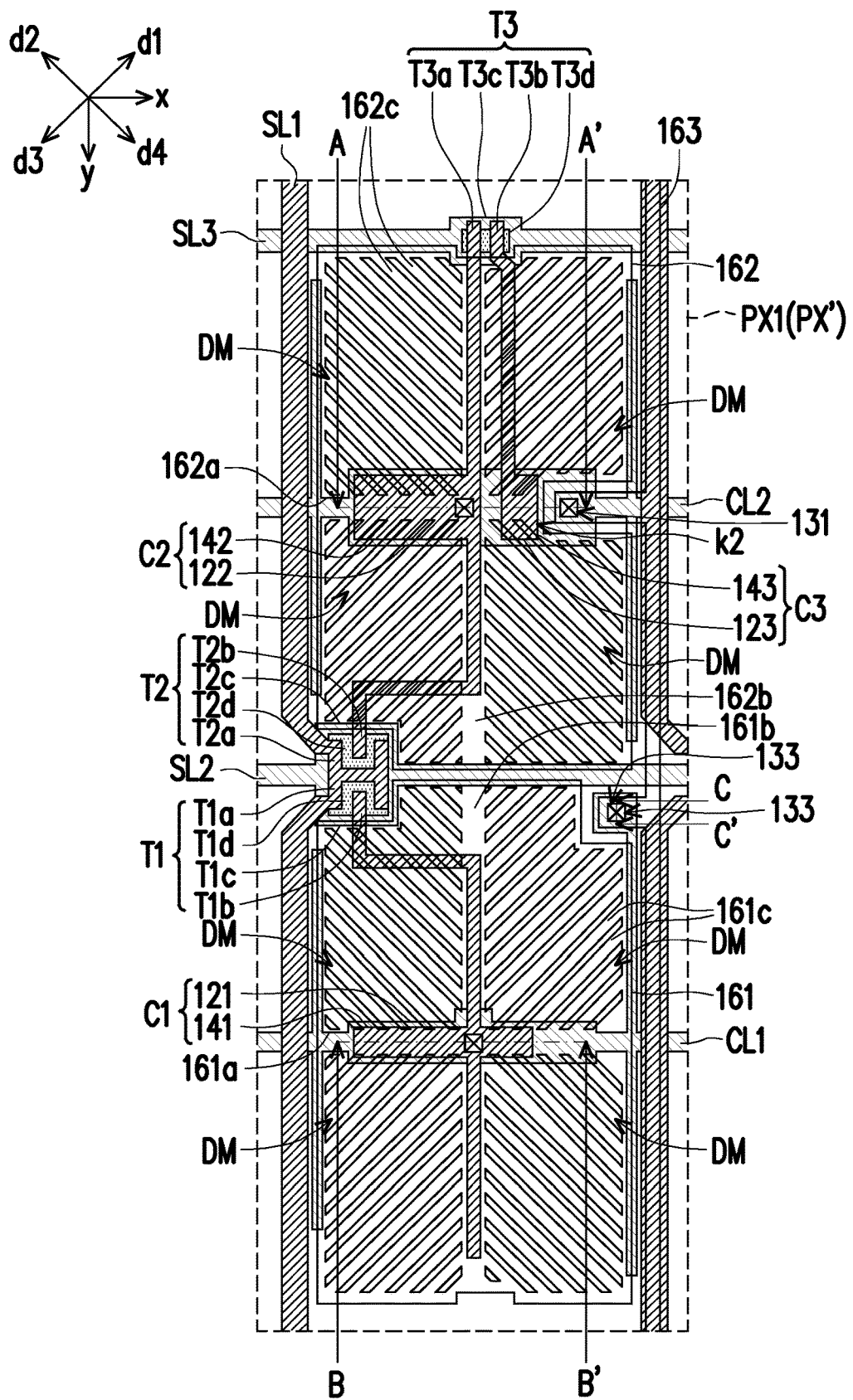
FIG. 9 is a top view of a pixel PX' of one embodiment of the disclosure.

FIG. 9 is a top view of a pixel PX' of one embodiment of the disclosure.

Figure 10:
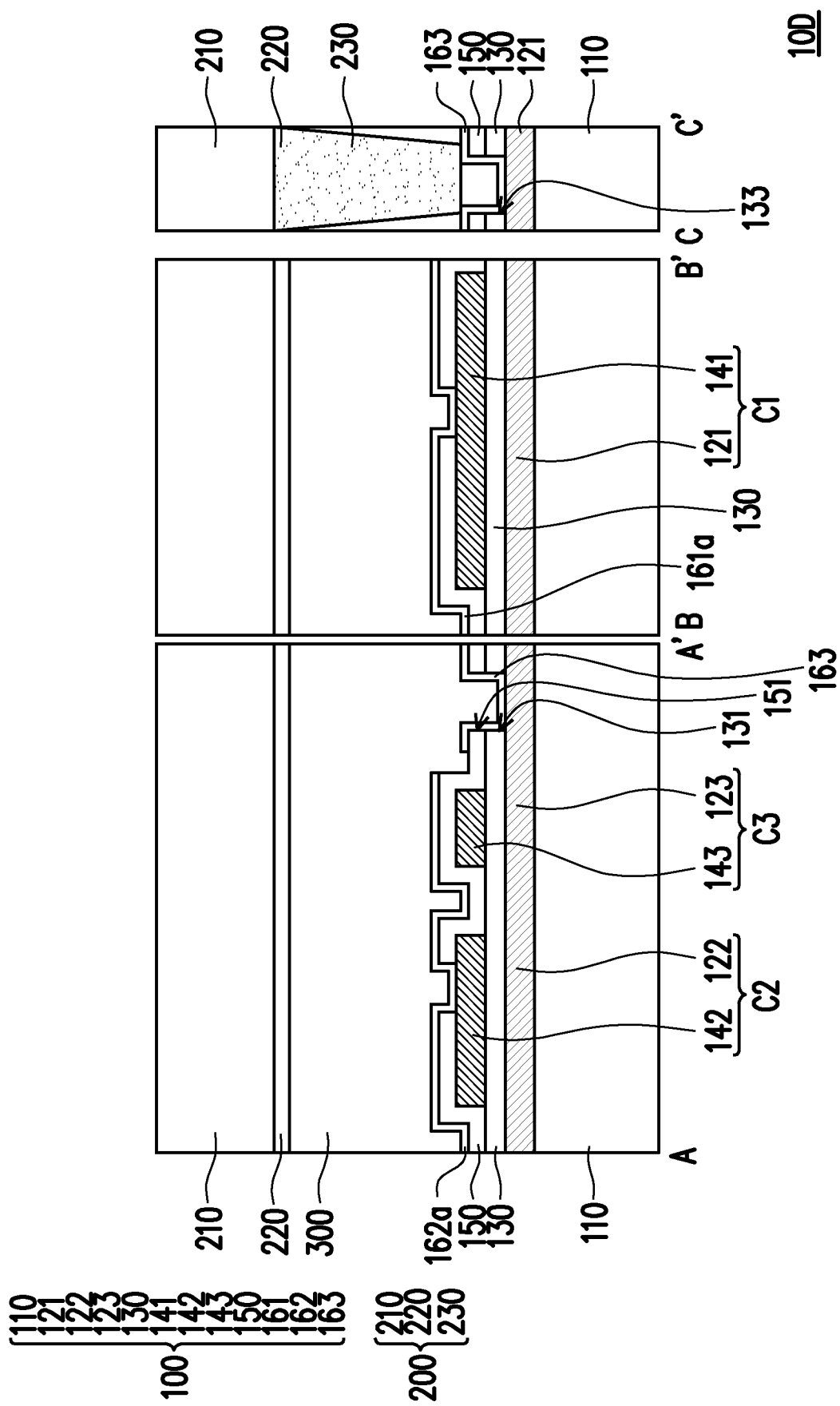
FIG. 10 is a cross-sectional schematic diagram of a display panel 10D of one embodiment of the disclosure.

FIG. 10 is a cross-sectional schematic diagram of a display panel 10D of one embodiment of the disclosure. FIG. 10 corresponds to a split line A-A', a split line B-B' and a split line C-C' in FIG. 9.

The display panel 10D in FIG. 8 is similar to the display panel 10 in FIG. 1. A main difference therebetween is that pixels PX' in FIG. 8 are slightly different from the pixels PX in FIG. 1.

With reference to FIG. 8 and FIG. 9, specifically, in the present embodiment, the insulating layers 130 of the pixels PX' do not have the aforementioned contact windows 132, and the insulating layers 130 of the pixels PX' have third contact windows 133 disposed at different positions.

With reference to FIG. 8, FIG. 9, and FIG. 10, specifically, in the present embodiment, the display panel 10D further includes a spacer 230 disposed between the first substrate 110 and the second substrate 210. For example, in the present embodiment, the spacer 230 is selectively disposed on the second substrate 210. However, the disclosure is not limited thereto. According to other embodiments, the spacer 230 may be also disposed on the first substrate 110.

The insulating layers 130 of the pixels PX' further include the third contact windows 133. In the present embodiment, the first conductive elements 163 may be electrically connected to the second electrodes 121 of the first capacitors C1 of the pixels PX' through the third contact windows 133 of the insulating layers 130 and the third contact windows 133 of the insulating layers 150. Particularly, the third contact windows 133 overlap the spacers 230. That is, in the present embodiment, the third contact windows 133 are disposed in original lightproof regions of the display panel 10D, so the setting of the third contact windows 133 is not liable to affect the transmittance rate of the display panel 10D.

Figure 11:
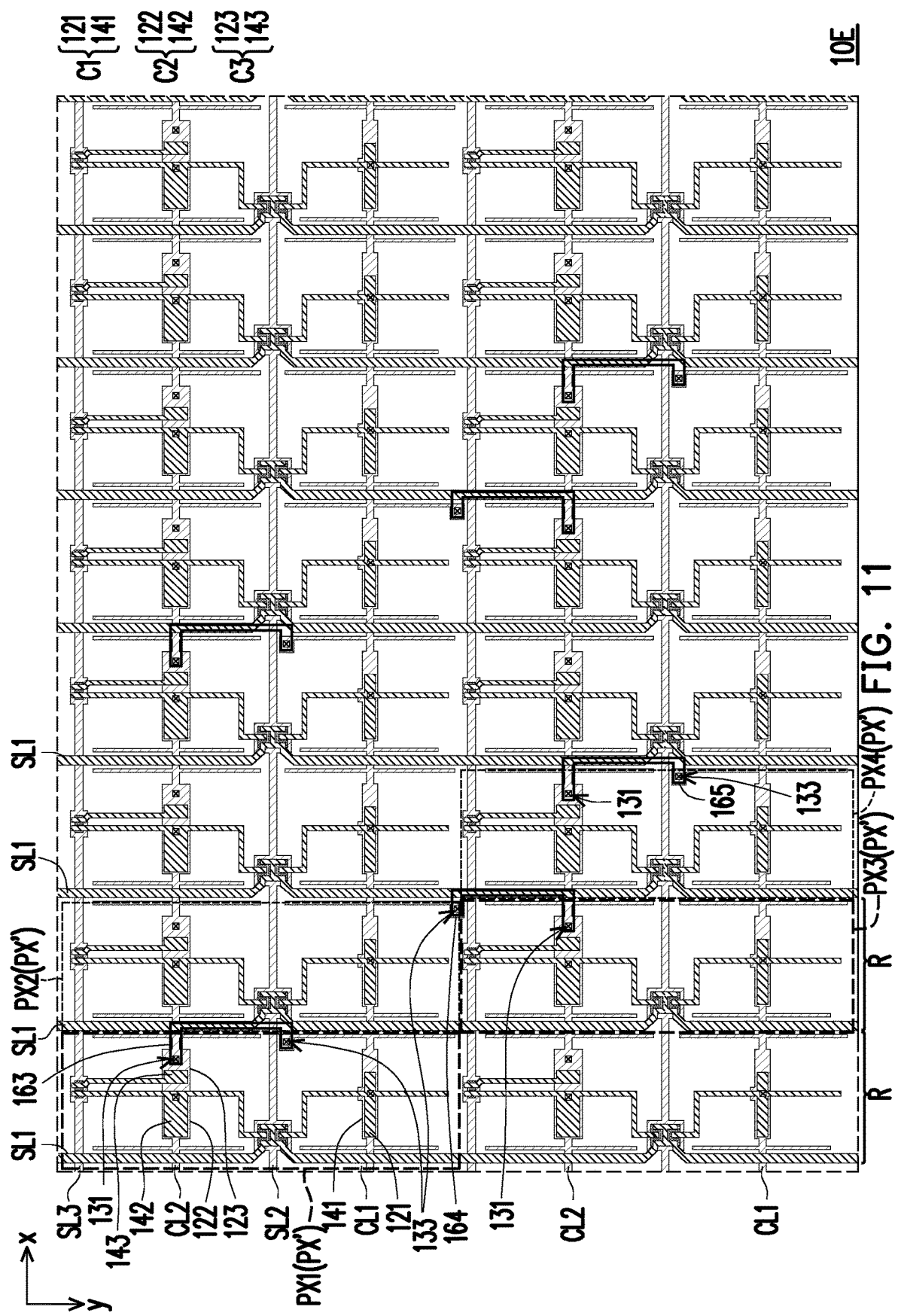
FIG. 11 is a top view of a display panel 10E of another embodiment of the disclosure.

FIG. 11 is a top view of a display panel 10E of another embodiment of the disclosure. For clear expression, the opposite substrate 200, the first pixel electrodes 161 and the second pixel electrodes 162 are omitted in FIG. 11.

The display panel 10E in FIG. 11 is similar to the display panel 10D in FIG. 8. A main difference therebetween is that: according to the embodiment illustrated in FIG. 8, each pixel PX of the $(1+3n)^{th}$ pixel row R is provided with the first conductive element 163 electrically connected to the first common line CL1 of the pixel PX and the second common line CL2 of the pixel PX, and the first conductive elements 163 on the pixels PX of the $(1+3n)^{th}$ pixel row R are directly connected, wherein n is 0 or a positive integer. According to the embodiment illustrated in FIG. 11, not every pixel PX of the $(1+3n)^{th}$ pixel row R is provided with the first conductive element 163, and the first conductive elements 163 on the $(1+3n)^{th}$ pixel row R are structurally separated. In addition, according to the embodiment illustrated in FIG. 11, the display panel 10E further includes a second conductive element 164 and a third conductive element 165 in addition to the first conductive elements 163 configured to electrically connect the first common line CL1 of the first pixel PX1 with the second common line CL2 of the first pixel PX1.

With reference to FIG. 11, specifically, in the present embodiment, the display panel 10E further includes the second conductive element 164. The second conductive element 164 is electrically connected to the second electrode 123 of the third capacitor C3 of the third pixel PX3 and the second electrode 122 of the second capacitor C2 of the third pixel PX3 through the first contact window 131 of the third pixel PX3. In the present embodiment, the second conductive element 164 may also be electrically connected to the second electrode 121 of the first capacitor C1 of the second pixel PX2 through the third contact window 133 of the second pixel PX2.

The display panel 10E further includes the third conductive element 165. The third conductive element 165 is electrically connected to the second electrode 123 of the third capacitor C3 of the fourth pixel PX4 and the second electrode 122 of the second capacitor C2 of the fourth pixel PX4 through the first contact window 131 of the fourth pixel PX4. In the present embodiment, the third conductive element 165 may also be electrically connected to the second electrode 121 of the first capacitor C1 of the fourth pixel PX4 through the third contact window 133 of the fourth pixel PX4.

Figure 12:
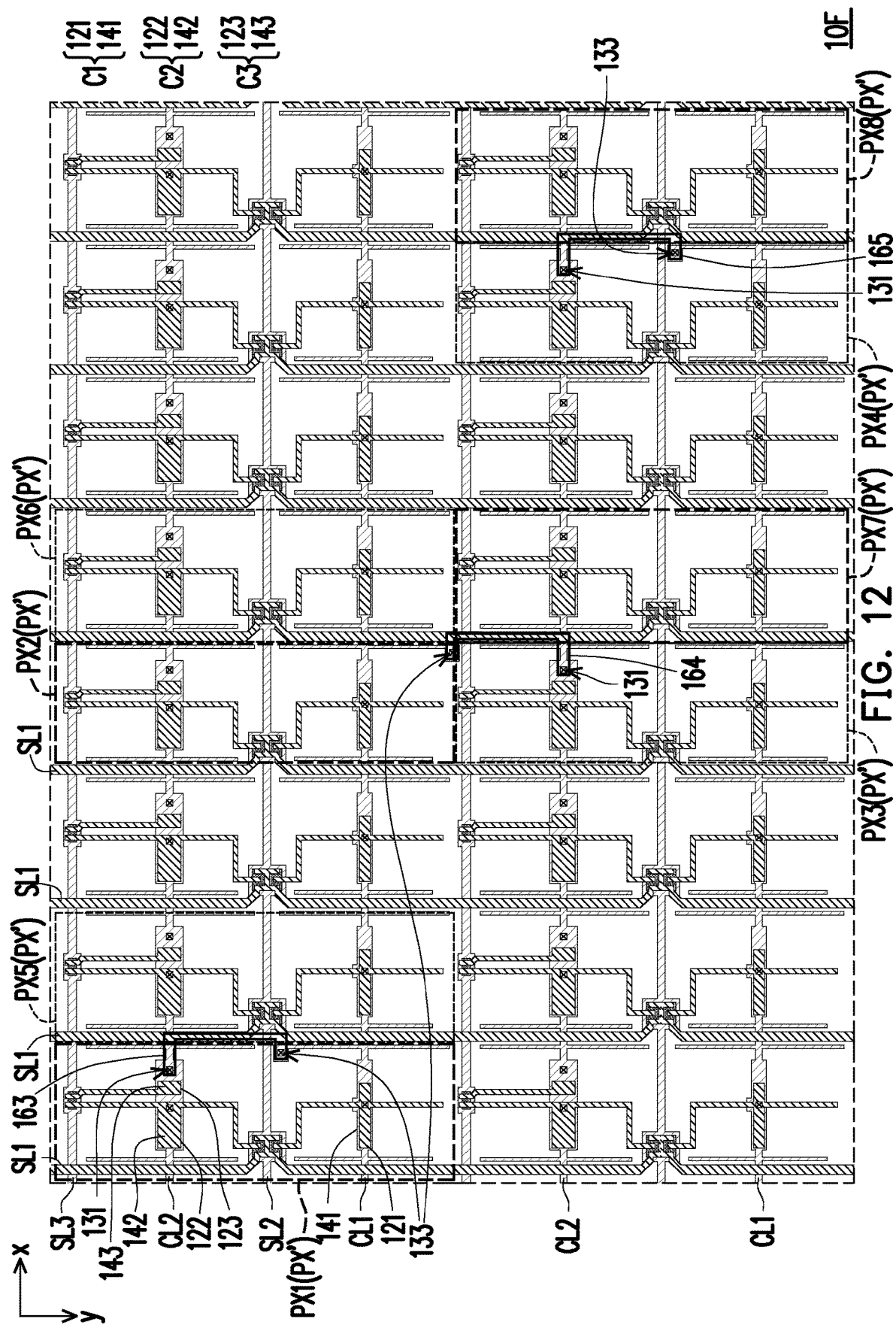
FIG. 12 is a top view of a display panel 10F of a further embodiment of the disclosure.

FIG. 12 is a top view of a display panel 10F of a further embodiment of the disclosure. The opposite substrate 200, the first pixel electrodes 161 and the second pixel electrodes 162 are omitted in FIG. 12.

The display panel 10F in FIG. 12 is similar to the display panel 10E in FIG. 11. A main difference therebetween is as follows.

With reference to FIG. 12, in the present embodiment, each pixel PX' has a first side (for example: the right side) and an opposite second side (for example: the left side). The pixels PX' further include a fifth pixel PX5, a sixth pixel PX6, a seventh pixel PX7 and an eighth pixel PX8 in addition to the first pixel PX1, the second pixel PX2, the third pixel PX3 and the fourth pixel PX4. The fifth pixel PX5, the sixth pixel PX6, the seventh pixel PX7 and the eighth pixel PX8 are respectively located on the first side of the first pixel PX1, the first side of the second pixel PX2, the first side of the third pixel PX3 and the first side of the fourth pixel PX4, and the fifth pixel PX5, the sixth pixel PX6, the seventh pixel PX7 and the eighth pixel PX8 are respectively aligned with the first pixel PX1, the second pixel PX2, the third pixel PX3 and the fourth pixel PX4 in the first direction x.

The first conductive element 163 overlaps the first signal line SL1 of the fifth pixel PX5. The second conductive element 164 overlaps the first signal line SL1 of the sixth pixel PX6 and the first signal line SL1 of the seventh pixel PX7. The third conductive element 165 overlaps the first signal line SL1 of the eighth pixel PX8.

Particularly, in the present embodiment, the fifth pixel PX5, the sixth pixel PX6, the seventh pixel PX7 and the eighth pixel PX8 are configured to display the blue color. That is, the first conductive elements 163, the second conductive elements 164 and the third conductive elements 165 which are configured to connect the adjacent plurality of first and second common lines CL1, CL2 are disposed on the first signal lines SL1 of the pixels PX' configured to display the blue color.

In the present embodiment, the overall load on the first signal lines SL1 of the display panel 10F is low, and the first conductive element 163, the second conductive element 164 and the third conductive element 165 may further be dispersed in a dotted manner from the macroscopic angle, which contributes to improving the visual effect of the display panel 10F.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
   a first substrate;
   a plurality of pixels, disposed on the first substrate, wherein each of the pixels comprises:
      a first signal line;
      a second signal line;
      a third signal line;
      a first switch, a second switch, and a third switch, wherein each of the first switch, the second switch, and the third switch comprises a first end, a control end, and a second end;
      a first pixel electrode and a second pixel electrode;
      a first capacitor, a second capacitor, and a third capacitor, wherein each of the first capacitor, the second capacitor, and the third capacitor comprises a first electrode and a second electrode; the first end of the first switch is electrically connected to the first signal line, the control end of the first switch is electrically connected to the second signal line, the second end of the first switch is electrically connected to the first pixel electrode and the first electrode of the first capacitor, the first end of the second switch is electrically connected to the first signal line, the control end of the second switch is electrically connected to the second signal line, the second end of the second switch is electrically connected to the second pixel electrode and the first electrode of the second capacitor, the first end of the third switch is electrically connected to the first electrode of the second capacitor, the control end of the third switch is electrically connected to the third signal line, and the second end of the third switch is electrically connected to the first electrode of the third capacitor; and
      an insulating layer, disposed on the second electrode of the second capacitor and the second electrode of the third capacitor; and
   at least one first conductive element, wherein the first signal lines of the pixels are arranged in a first direction, the pixels comprise a first pixel, the insulating layer of the first pixel comprises a first contact window, a plurality of orthogonal projections of the first electrode of the second capacitor of the first pixel, the first electrode of the third capacitor of the first pixel, and the first contact window of the insulating layer of the first pixel on the first substrate are arranged in the first direction, the at least one first conductive element is disposed on the insulating layer and is electrically connected to the second electrode of the third capacitor of the first pixel and the second electrode of the second capacitor of the first pixel through the first contact window of the first pixel, and the second electrode of the first capacitor of the first pixel is electrically connected to the at least one first conductive element.

2. The display panel according to claim 1, wherein the second pixel electrode of the first pixel comprises:
   a main portion; and
   a plurality of branch portions, respectively disposed on two opposite sides of the main portion and electrically connected to the main portion, wherein the main portion extends in the first direction, and at least one of the first electrode of the second capacitor of the first pixel and the first electrode of the third capacitor of the first pixel overlaps the main portion.

3. The display panel according to claim 1, wherein the insulating layer of the first pixel further comprises a second contact window, the at least one first conductive element is electrically connected to the second electrode of the first capacitor of the first pixel through the second contact window, and a plurality of orthogonal projections of the first electrode of the first capacitor of the first pixel and the second contact window of the insulating layer of the first pixel on the first substrate are arranged in the first direction.

4. The display panel according to claim 3, wherein the first pixel electrode of the first pixel comprises:
   a main portion; and
   a plurality of branch portions, respectively disposed on two opposite sides of the main portion and electrically connected to the main portion, wherein the main portion extends in the first direction, and the first electrode of the first capacitor of the first pixel overlaps the main portion.

5. The display panel according to claim 3, wherein the first pixel electrode and the second pixel electrode are arranged in a second direction, the first direction and the second direction are interlaced, the pixels comprise a first pixel row, the pixels of the first pixel row are arranged in the second direction, and the at least one first conductive element is electrically connected to the second electrodes of the third capacitors, the second electrodes of the second capacitors, and the second electrodes of the first capacitors of the pixels of the first pixel row.

6. The display panel according to claim 5, wherein the pixels further comprise a second pixel row disposed beside the first pixel row, the pixels of the second pixel row are arranged in the second direction, the at least one first conductive element overlaps the first signal lines of the pixels of the second pixel row, and the pixels of the second pixel row are configured to display a blue color.

7. The display panel according to claim 3, wherein the pixels further comprise a second pixel and a third pixel, the first pixel and the second pixel are arranged in the first direction, the second pixel and the third pixel are arranged in a second direction, the first direction and the second direction are interlaced, and the display panel further comprises:
   a second conductive element, wherein the insulating layer of the third pixel comprises a first contact window, a plurality of orthogonal projections of the first electrode of the second capacitor of the third pixel, the first electrode of the third capacitor of the third pixel, and the first contact window of the insulating layer of the third pixel on the first substrate are arranged in the first direction, the second conductive element is disposed on the insulating layer of the third pixel and is electrically connected to the second electrode of the third capacitor of the third pixel and the second electrode of the second capacitor of the third pixel through the first contact window of the third pixel, and the second electrode of the first capacitor of the second pixel is electrically connected to the second conductive element.

8. The display panel according to claim 7, wherein the pixels further comprise a fourth pixel, the third pixel and the fourth pixel are arranged in the first direction, the first pixel and the fourth pixel are respectively located on two opposite sides of the second pixel and the third pixel, and the display panel further comprises:

a third conductive element, wherein the insulating layer of the fourth pixel comprises a first contact window, a plurality of orthogonal projections of the first electrode of the second capacitor of the fourth pixel, the first electrode of the third capacitor of the fourth pixel, and the first contact window of the insulating layer of the fourth pixel on the first substrate are arranged in the first direction, the third conductive element is disposed on the insulating layer of the fourth pixel and is electrically connected to the second electrode of the third capacitor of the fourth pixel and the second electrode of the second capacitor of the fourth pixel through the first contact window of the fourth pixel, and the second electrode of the first capacitor of the fourth pixel is electrically connected to the third conductive element.

9. The display panel according to claim 8, wherein the first pixel is configured to display a first color, the second pixel and the third pixel are configured to display a second color, and the fourth pixel is configured to display a third color.

10. The display panel according to claim 8, wherein each of the pixels comprises a first side and a second side opposite to each other, the pixels further comprise a fifth pixel, a sixth pixel, a seventh pixel, and an eighth pixel, the fifth pixel, the sixth pixel, the seventh pixel, and the eighth pixel are respectively located on the first side of the first pixel, the first side of the second pixel, the first side of the third pixel, and the first side of the fourth pixel, the fifth pixel, the sixth pixel, the seventh pixel, and the eighth pixel are respectively aligned with the first pixel, the second pixel, the third pixel, and the fourth pixel in the first direction, the at least one first conductive element overlaps the first signal line of the fifth pixel, the second conductive element overlaps the first signal line of the sixth pixel and the first signal line of the seventh pixel, the third conductive element overlaps the first signal line of the eighth pixel, and the fifth pixel, the sixth pixel, the seventh pixel, and the eighth pixel are configured to display a blue color.

11. The display panel according to claim 1, wherein the insulating layer of the first pixel further comprises a third contact window, the at least one first conductive element is electrically connected to the second electrode of the first capacitor of the first pixel through the third contact window, and the display panel further comprises:

a second substrate, opposite to the first substrate; and
a spacer, disposed between the first substrate and the second substrate, and overlapping the third contact window of the insulating layer of the first pixel.

12. The display panel according to claim 11, wherein the first pixel electrode and the second pixel electrode are arranged in a second direction, the first direction and the second direction are interlaced, the pixels comprise a first pixel row, the pixels of the first pixel row are arranged in the second direction, and the at least one first conductive element is electrically connected to the second electrodes of the third capacitors, the second electrodes of the second capacitors, and the second electrodes of the first capacitors of the pixels of the first pixel row.

13. The display panel according to claim 12, wherein the pixels further comprise a second pixel row disposed beside the first pixel row, the pixels of the second pixel row are arranged in the second direction, the at least one first conductive element overlaps the first signal lines of the pixels of the second pixel row, and the pixels of the second pixel row are configured to display a blue color.

14. The display panel according to claim 11, wherein the pixels further comprise a second pixel and a third pixel, the first pixel and the second pixel are arranged in the first direction, the second pixel and the third pixel are arranged in a second direction, the first direction and the second direction are interlaced, and the display panel further comprises:

a second conductive element, wherein the insulating layer of the third pixel comprises a first contact window, a plurality of orthogonal projections of the first electrode of the second capacitor of the third pixel, the first electrode of the third capacitor of the third pixel, and the first contact window of the insulating layer of the third pixel on the first substrate are arranged in the first direction, the second conductive element is disposed on the insulating layer of the third pixel and is electrically connected to the second electrode of the third capacitor of the third pixel and the second electrode of the second capacitor of the third pixel through the first contact window of the third pixel, and the second electrode of the first capacitor of the second pixel is electrically connected to the second conductive element.

15. The display panel according to claim 14, wherein the pixels further comprise a fourth pixel, the third pixel and the fourth pixel are arranged in the second direction, the first pixel and the fourth pixel are respectively located on two opposite sides of the second pixel and the third pixel, and the display panel further comprises:

a third conductive element, wherein the insulating layer of the fourth pixel comprises a first contact window, a plurality of orthogonal projections of the first electrode of the second capacitor of the fourth pixel, the first electrode of the third capacitor of the fourth pixel, and the first contact window of the insulating layer of the fourth pixel on the first substrate are arranged in the first direction, the third conductive element is disposed on the insulating layer of the fourth pixel and is electrically connected to the second electrode of the third capacitor of the fourth pixel and the second electrode of the second capacitor of the fourth pixel through the first contact window of the fourth pixel, and the second electrode of the first capacitor of the fourth pixel is electrically connected to the third conductive element.

16. The display panel according to claim 15, wherein the first pixel is configured to display a first color, the second pixel and the third pixel are configured to display a second color, and the fourth pixel is configured to display a third color.

17. The display panel according to claim 15, wherein each of the pixels comprises a first side and a second side opposite to each other, the pixels further comprise a fifth pixel, a sixth pixel, a seventh pixel, and an eighth pixel, the fifth pixel, the sixth pixel, the seventh pixel, and the eighth pixel are respectively located on the first side of the first pixel, the first side of the second pixel, the first side of the third pixel, and the first side of the fourth pixel, the fifth pixel, the sixth pixel, the seventh pixel, and the eighth pixel are respectively aligned with the first pixel, the second pixel, the third pixel, and the fourth pixel in the first direction, the at least one first conductive element overlaps the first signal line of the fifth pixel, the second conductive element overlaps the first signal line of the sixth pixel and the first signal line of the seventh pixel, the third conductive element overlaps the first signal line of the eighth pixel, and the fifth pixel, the sixth pixel, the seventh pixel, and the eighth pixel are configured to display a blue color.

* * * * *